United States Patent
Sicard et al.

(10) Patent No.: US 9,356,515 B2
(45) Date of Patent: May 31, 2016

(54) POWER SWITCHING DEVICE, THREE PHASE BRIDGE INVERTER, AND METHOD OF OPERATING A POWER SWITCHING DEVICE

(75) Inventors: Thierry Sicard, Auzeville Tolosane (FR); Randall Gray, Tempe, AZ (US); Philippe Perruchoud, Tournefeuille (FR); John Pigott, Phoenix, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/423,721

(22) PCT Filed: Sep. 14, 2012

(86) PCT No.: PCT/IB2012/002021
§ 371 (c)(1),
(2), (4) Date: Feb. 25, 2015

(87) PCT Pub. No.: WO2014/041386
PCT Pub. Date: Mar. 20, 2014

(65) Prior Publication Data
US 2015/0188426 A1    Jul. 2, 2015

(51) Int. Cl.
*H02P 3/18*    (2006.01)
*H02M 3/158*    (2006.01)
(Continued)

(52) U.S. Cl.
CPC .............. *H02M 3/158* (2013.01); *H02M 1/32* (2013.01); *H02M 1/34* (2013.01); *H02M 3/1563* (2013.01);
(Continued)

(58) Field of Classification Search
CPC ..... H02M 1/32; H02M 3/1563; H02M 3/158; H02M 7/5387; H02M 7/53871; H02P 27/08; H03K 17/687; H03K 5/249
USPC ............................ 318/812, 504, 434, 478, 479
See application file for complete search history.

(56) References Cited

U.S. PATENT DOCUMENTS 3,594,623 A * 7/1971 Lamaster ................ H02P 27/06
                                                      318/137
5,877,646 A    3/1999 Jorg
(Continued)

FOREIGN PATENT DOCUMENTS

| JP | 03-183355 A | 8/1991 |
|----|----|----|
| JP | 08-294285 A | 11/1996 |
| JP | 2004-194449 A | 7/2004 |

OTHER PUBLICATIONS

International Search Report and Written Opinion correlating to PCT/IB2012/002021 dated Mar. 8, 2013.

*Primary Examiner* — Bentsu Ro
*Assistant Examiner* — Thai Dinh

(57) ABSTRACT

A power switching device includes a power terminal connected to a power supply; a load terminal connected to a load; a power switch connected between said power terminal and said load terminal and arranged to be conductive in a first operating state; a power conductor connected between said power terminal and said load terminal in at least one state, wherein an electrical current through said power conductor changes in response to said power switch being turned off, thereby causing self-induction in said power conductor; and a control unit arranged to control said power switch in real-time on the basis of a real-time level of said voltage across said power conductor so as to turn off said power switch in a continuous or stepwise or pulsed manner to prevent a voltage across said power conductor from exceeding a maximum allowed level.

15 Claims, 12 Drawing Sheets

(51) Int. Cl.
  *H03K 17/687* (2006.01)
  *H02M 1/34* (2007.01)
  *H02M 7/5387* (2007.01)
  *H02M 1/32* (2007.01)
  *H03K 17/16* (2006.01)
  *H02M 3/156* (2006.01)
  *H02P 27/08* (2006.01)
  *H02M 1/00* (2006.01)

(52) U.S. Cl.
  CPC ........ *H02M 7/5387* (2013.01); *H02M 7/53871* (2013.01); *H02P 27/08* (2013.01); *H03K 17/166* (2013.01); *H03K 17/687* (2013.01); *H02M 2001/0058* (2013.01); *Y02B 70/1491* (2013.01)

(56) References Cited

U.S. PATENT DOCUMENTS

| | | | |
|---|---|---|---|
| 6,097,582 A | 8/2000 | John et al. | |
| 6,970,364 B2 | 11/2005 | Batarseh et al. | |
| 6,989,649 B2 * | 1/2006 | Mehlhorn | F04D 15/0218 318/805 |
| 7,042,192 B2 * | 5/2006 | Mehlhorn | F04D 15/0218 318/727 |
| 7,221,117 B2 * | 5/2007 | Jadot | H02P 21/10 318/268 |
| 7,368,972 B2 | 5/2008 | Grbovic | |
| 7,427,844 B2 * | 9/2008 | Mehlhorn | F04D 15/0218 307/118 |
| 2006/0181831 A1 | 8/2006 | Kojima | |
| 2008/0130177 A1 | 6/2008 | Vlasenko et al. | |
| 2011/0051371 A1 | 3/2011 | Azuma et al. | |

* cited by examiner

10

POWER SWITCHING DEVICE, THREE PHASE BRIDGE INVERTER, AND METHOD OF OPERATING A POWER SWITCHING DEVICE

FIELD OF THE INVENTION

This invention relates to a power switching device, a three phase bridge inverter, and a method of operating a power switching device.

BACKGROUND OF THE INVENTION

A power switch is a switch capable of transmitting a powerful current. A power switch may, for example, be connected between a power supply and an electric load and be operated so as to control the electrical current drawn by the load and thus, an instantaneous power of the load. An electric circuit may generally comprise both power lines and control lines. A power line may be distinguished from a control line in that it may be arranged to feed power to one or more electrical loads, whereas a control line (signal line) may be arranged for transmitting only very little power. Whether a given conductor is a power line or a control line may depend on the application in question. For instance, a power line in a microscopic or miniaturized device may have dimensions similar to a control line in a macroscopic device. A power line and a power switch may be defined, respectively, as a conductor and a switch connected or connectable in series with a load. A control line and a control switch may be defined as a conductor and a switch, respectively, which may be operated to control, e.g., a current through the load or a voltage across the load without being connected in series with the load.

A power switch may be turned on and off. Turning on may be defined as controlling the switch to pass from a nonconductive state into a conductive state. Turning off may be defined as controlling the switch to pass from a conductive state into a nonconductive state. When the switch is conductive, it is said to be on or closed. When the switch is nonconductive, it is said to be off or open.

A problem that may be encountered with operating a power switch is that of voltage spikes which may be generated by inductive elements in the circuit when the power switch is turned off. High voltages may thus be generated across the power switch or across other components of the circuit when the power switch is abruptly turned off. Such voltages may be detrimental to the circuit.

SUMMARY OF THE INVENTION

The present invention provides a power switching device, a three phase bridge inverter, and a method of operating a power switching device as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Figure 1:
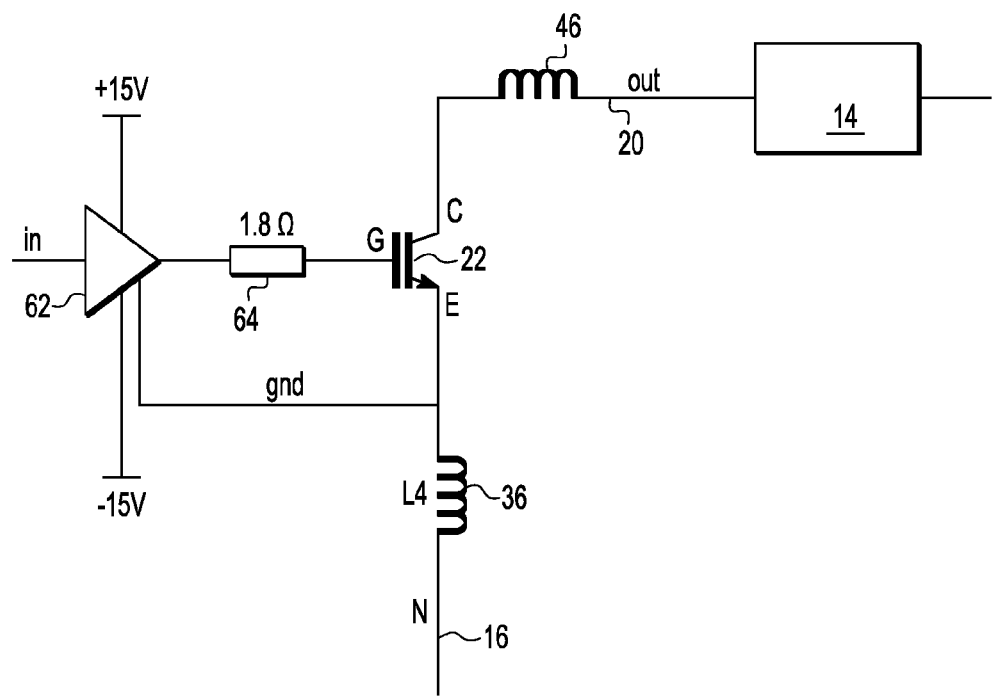
FIG. 1 schematically shows an example of an embodiment of a power switching device.

FIG. 1 illustrates an example of a power switching device 10. The power switching device 10 may be connected between a power supply (not shown) and a load 14 to provide an output voltage to the load. The power switching device 10 may have at least two different operating states. Each operating state may have associated with it a distinct level of the output voltage. For instance, the power switching device 10 may have a first and a second operating state for generating a first output voltage level and a second output voltage level, respectively. The power switching device 10 may comprise a power terminal 16 connected to the power supply. It may further comprise a load terminal 20 for providing the output voltage. The load terminal 20 may be connected to the load 14. The load 14 may thus be connected between the load terminal 20 and one or more other load terminals (not shown). The one or more other load terminals may be a part of the power switching device 10 or may be external to it.

A power switch 22 may be connected between the power terminal 16 and the load terminal 20. The power switch 22 may, for instance, be a power transistor, e.g., an insulated gate bipolar transistor (IGBT). In the shown example, the power switch 22 may be an IGBT having a collector C, an emitter E, and a gate G. The electrical conductivity of the power switch 22, which, in this example, is the conductivity of the collector emitter line CE, may be controlled by means of a gate voltage applied at the gate G. In this example, the power switch 22 may, for instance, comprise an NMOS transistor and a bipolar transistor (for example, as in FIG. 4). The conductivity of the power switch 22 may thus be increased by, e.g., increasing the gate voltage and decreased by, e.g., decreasing the gate voltage. The power switch 22 may, for instance, be designed to withstand a voltage of up to 500 volts or even higher voltages between its supply terminals, e.g., between the collector C and the emitter E, when in its non-conductive state. The power switch 22 may further be designed to support an electric current of up to, e.g., 10, 100, or 1000 amperes or even higher currents when in its conductive state.

The power switching device 10 may, for example, comprise an amplifier 62 having an output connected to the power switch 22, e.g., to the gate G, for controlling the power switch 22 in dependence on an input signal (in). The power switching device 10 may, for example, be arranged to have a first operating state in which the power switch 22 is conductive (on), and a second operating state in which the power switch 22 is nonconductive (off). In the first state, the load 14 may thus be connected to the power terminal 16 via a power line comprising the power switch 22. More specifically, the power line between the power terminal 16 and the load terminal 20 may in this example comprise the collector emitter line CE of the IGBT 22. Conceptually, the power line may be decomposed into one or more segments. Each segment may also be referred to as a power conductor. For example, the power line may comprise a power conductor 36 connected between the power terminal 16 and the power switch 22. The power line may further comprise a power conductor 46 between the power switch 22 and the load terminal 20. The power conductors 36 and 46 may, for instance, comprise one or more wires or one or more contact pads. Each segment of the power line from, e.g., node 16 to node 20 may have an inductance which may be non-negligible. In the Figures, such power conductors may therefore be represented as conductive elements. For instance, power conductor 36 may be a wire connecting the power switch 22, which may be located on a substrate (cf. FIG. 13), to the power terminal 16, which may be located elsewhere, i.e., not on the substrate. For example, the power terminal 16 may be located on a carrier, e.g., a frame structure, which may serve as an interface between the substrate and a power supply.

When the power switch 22 is turned off, the electrical current through the load and through the power switch 22 may decrease. The load and each segment of the power line connecting the load to the power supply (not shown) via, e.g., the power conductor 46, the power switch 22, the power conductor 36, and the power terminal 16 may thus induce an induction voltage across itself, e.g., in accordance with the induction law $V\_ind=-I*dI/dt$, where I is the inductance of the respective component or segment, and $dI/dt$ is the time derivative of the electrical current I, i.e., the rate of change of the electrical current I. It is noted that $dI/dt$ is not necessarily constant along the power line if capacitive effects must be taken into account. For instance, the power switch 22 may have a non-negligible parasitic capacitance.

The load connected to the load terminal 20 may notably comprise one or more inductors, e.g., one or more coils of an induction motor. In this case and in other cases, the inductance of the load may thus be many times greater that the inductance of any parasitic inductive elements, e.g., 36 and 46, in the circuit. Depending how fast the power switch 22 is opened, i.e., depending on the duration of the transition from its conductive state to its nonconductive state, the inductive voltages across the parasitic or dedicated inductive elements may be very large and may be detrimental to the circuit, e.g., to the power switch 22.

In the shown example, the power switching device 10 may comprise a resistive element 64, e.g., comprising one or more resistors arranged so as to limit the rate at which the control voltage applied at the power switch 22, e.g., the gate voltage, may change. In this example, the resistive element 64 may be connected between the output of the amplifier 62 and the control terminal (e.g., the gate) of the power switch 22. The resistive element 64 may, for instance, have a resistance of 1.8 ohm. As a consequence, when the output voltage generated at the output of the operational amplifier 62 is abruptly changed from a first stationary value to a second stationary value, e.g., decreased, the voltage at the control terminal, e.g., gate G, of the power switch 22 will not change as rapidly but rather in a gentler manner. The conductivity of the power switch 22 may thus be expected to decrease in a similar gentle manner. Induced voltage peaks in the circuit may thus be reduced.

Figure 2:
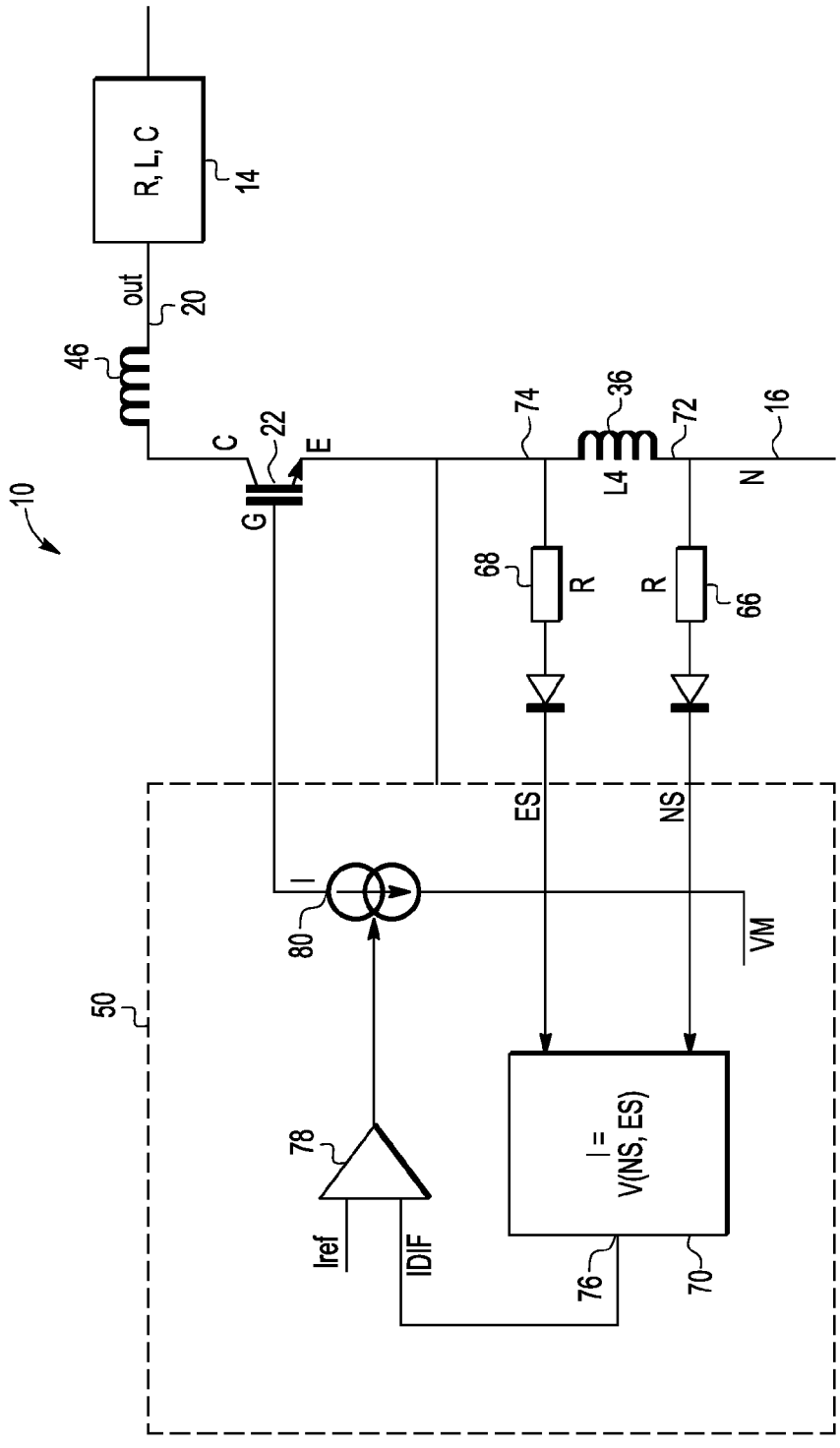
FIG. 2 schematically shows an example of an embodiment of a power switching device.

FIG. 2 shows another example of a power switching device 10. The power line, i.e., the line comprising, e.g., the power terminal 16, the power conductor 36, the power switch 22, the power conductor 46, and the load terminal 20, may be arranged, for example, as described in reference to FIG. 1. In this example, the power switching device 10 comprises a control unit 50 for controlling the power switch 22. The control unit 50 may be connected to the power switch 22 and to at least one of the inductive elements on the power line. The control unit 50 may notably be arranged to control the power switch 22 in real time on the basis of a real time level of the voltage across the power conductor 36 so as to turn off the power switch 22 in a continuous, stepwise, or pulsed manner to prevent the voltage across the power conductor 36 from exceeding a maximum allowed level. The rate of change of the electrical current at the various nodes of the power line 16, 36, 22, 46, 20 and the load 14 can thus be limited. As a consequence, induced voltages may also be limited. The maximum allowed level may be fixed or adjustable. The maximum allowed level may, for instance, be a level not higher than the voltage provided by, e.g., the power supply 12, e.g., not higher than three hundred volts. The maximum allowed level may, for example, be a level between ten and one hundred percent of the supply voltage, or between thirty and three hundred volts, e.g., approximately one hundred volts.

It is noted that if the power switch 22 was turned off differently, namely, abruptly or quasi instantly, the resulting abrupt change in current might induce voltages in the circuit which may be even larger than the voltage provided by the power supply 12.

In the example, the power switching circuit 10 may comprise a bridge 66, 68, 70 across one of the parasitic inductive elements, e.g., the power conductor 36. The bridge may comprise, for instance, a first resistive element 66 connected to, e.g., a first terminal 72 of the power conductor 36, and a second resistive element 68 connected to, e.g., a second terminal 74 of the power conductor 36. The first terminal 72 and the second terminal 74 may, for instance, be a node between the power conductor 36 and the power terminal 16 and a node between the power conductor 36 and the power switch 22, respectively. The first resistive element 66 and the second resistive element 68 may be connected to a current subtraction unit 70. The current subtraction unit 70 may have an output 76 for outputting a signal, e.g., an electrical current IDIF that may be proportional to the voltage between the nodes 72 and 74, i.e., proportional to the voltage across the power conductor 36. The output 76 of the current subtraction unit 70 may be connected to a comparison unit 78. The comparison unit 78 may be arranged to receive as a second input signal, a signal indicative of a maximum allowed voltage. This signal may, for instance, be a reference current Iref. The comparison unit 78 may thus compare the current from the current subtraction unit 70 and the reference current Iref and control the power switch 22 accordingly. In the shown example, the control unit 50 may comprise a current source 80 connected to the control input of the power switch 22. The comparison unit 78 may be arranged, for example, to keep the current source 80 in an idle state (zero current I) to close the switch 22 when the current from the current subtraction unit 70 is less than the reference current Iref and to operate the current source 80 to open the switch 22 when the current from the current subtraction unit 70 is greater than the reference current Iref.

An electrical current through the first resistive element 66 may thus be proportional to the voltage at the node 72 minus an internal reference voltage of the current subtraction unit 70. Similarly, an electrical current through the second resistive element 68 may be proportional to the difference of the voltage at node 74 and the same internal reference voltage of the current subtraction unit 70. The power switch 22 may thus be turned off in a continuous, stepwise, or pulsed manner by using the real time voltage across the power conductor or another suitable parasitic inductor as a feedback quantity. In other words, the voltage across the power conductor or parasitic inductor 36 may be controlled by means of a feedback loop. In this example, the feedback loop may comprise, e.g., the control unit 50 and the power switch 22.

The proposed feedback scheme may have a number of advantages compared to the resistive element 64 described in reference to FIG. 1. First of all, it is noted that in a circuit as shown in FIG. 1, charging or decharging the control input (e.g., the gate) of the power switch 22 may take unnecessarily long because the charging or decharging current may be proportional to the voltage across the resistive element 64. The charging or decharging current through the resistive element 64 may therefore decrease exponentially. In contrast, the control unit 50 may allow the voltage at the control input of the power switch 22 to be set almost instantaneously to a desired level. The power switch 22 may thus be controlled more rapidly compared to the circuit of FIG. 1. In particular, the control unit 50 may allow the control switch 22 to be turned off more rapidly. This may be particularly advantageous for applications in which a high switching rate is desired. For instance, a short turn off time may be beneficial for operating the power switch 22 to generate pulse width modulated (PWM) output voltage.

It is noted that the power switch 22 may be turned on or capped in its on state by setting the reference current !ref to zero or to a negative level. However, additional circuitry (not shown) may be included in the control unit 50 for turning the power switch 22 on.

Figure 3:
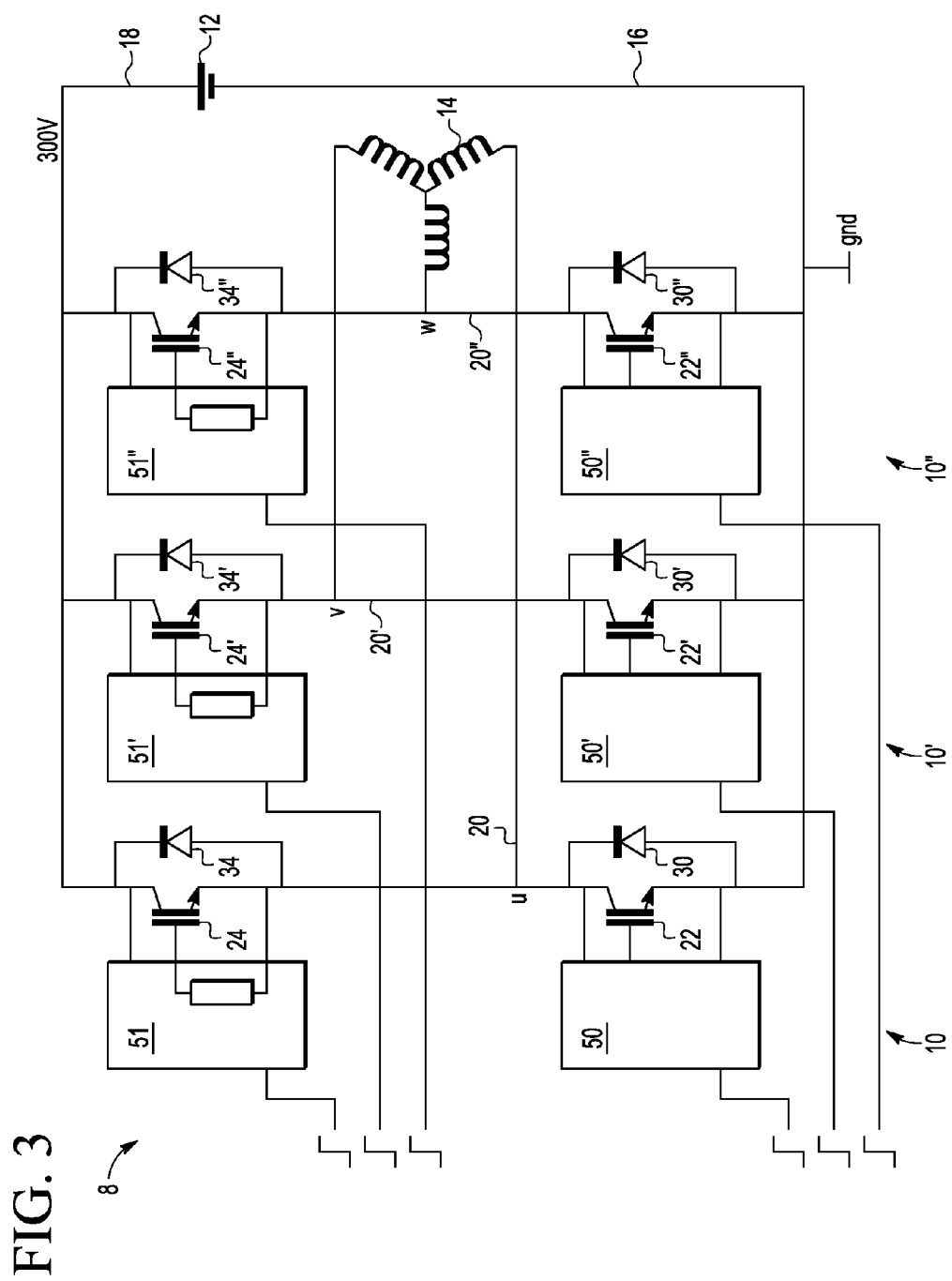
FIG. 3 schematically shows an example of an embodiment of a three phase bridge inverter.

FIG. 3 illustrates an example of a three phase bridge inverter. The load 14 mentioned above in reference to FIGS. 1 and 2 may, for example, be a three phase induction motor 14. The three phase bridge inverter may comprise identical or similar switching devices 10, 10', 10". In the shown example, each switching device 10, 10', 10" may comprise, e.g., a first power switch 22, 22', 22" and a second power switch 24, 24', 24", respectively. Each power switching device 10, 10', 10" may be arranged as a bridge between a first power terminal 16 and a second power terminal 18. A power supply 12 may be connected between the first power terminal 16 and the second power terminal 18. The power supply 12 may be arranged, for instance, to provide a supply voltage of, e.g., 300 volts. Each power switching device 10, 10', 10" may have a respective load terminal 20, 20', 20". The three load terminals 20, 20', 20" may be connected to the three terminals of the three phase induction motor 14, for example.

Each of the switching devices 10, 10', 10" may be arranged to provide a periodic output voltage at the respective load terminal 20, 20', 20". The three output voltages thus generated may be dephased relative to each other by, e.g., 120° so that their sum may always be zero. For instance, each power switching device 10, 10', 10" may generate a PWM output voltage. Each power switching device may thus simulate, for instance, a sinusoidal output voltage in the sense that when the output voltage is averaged over one cycle of the PWM signal, the effective output voltage is a step function approximation of a sine function. A period of the sine function may comprise several PWM cycles or only one PWM cycle. In the crudest of all approximations, there is only one PWM cycle per sine period. In this case, the sine function is approximated by a square wave of the same period.

Focusing on the first power switching device 10 in the three phase bridge inverter 8, it is noted that the two power switches 22 and 24 may be arranged to be switched on in an alternating manner, i.e., power switch 22 may be turned on only when power switch 24 has been turned off, and vice versa. When the first power switch 22 is on and the second power switch 24 is off, the output voltage at the load terminal 20 may be low. For instance, it may coincide approximately with the voltage of the first power terminal 16. In contrast, when the first power switch 22 is off and the second power switch 24 is on, the output voltage at the load terminal 20 may be high. For instance, it may then coincide approximately with the voltage of the second power terminal 18. The first power switch 22 and the second power switch 24 may therefore also be referred to as a pull-down switch 22 and a pull-up switch 24, respectively. The same is true analogously for the second power switching device 10' and the third power switching device 10".

Each of the power switches 22 and 24 may have connected across it a protective diode 30, 34, respectively. The power switch 22, 24 and the corresponding diode 30, 34 may be antiparallel. Negative voltage spikes, i.e., voltage spikes with a polarity opposed to the voltage source 12 which may be produced, for instance, by the load 14 in response to a certain variation of the electrical current may thus be relieved by a reverse current via one of the protective diodes 30 and 34. A reverse current through one of the protective diodes 30, 34 may also be referred to as a capacitive current because it may involve an accumulation of charge at, e.g., the power supply 12.

The power switching device 10 may comprise a first control unit 50 for controlling a turn-off transition of the power switch 22 by means of a feedback loop on the basis of, e.g., the induced voltage across a parasitic inductor (not shown in this figure) that may be series with the power switch 22. A second control unit 51 may similarly be arranged to turn off the second power switch 24 in a controlled manner by means of a feedback loop based on the induced voltage across a parasitic inductor (not shown in this figure) that may be series with the second power switch 24. In an alternative design, the same parasitic inductor, e.g., the power conductor 36 (see FIGS. 1 and 2) may be used to provide an induction voltage as a basis for controlling both the first power switch 22 and the second power switch 24. In other words, the first control unit 50 and the second control unit 51 are not necessarily symmetrical to each other.

Figure 4:
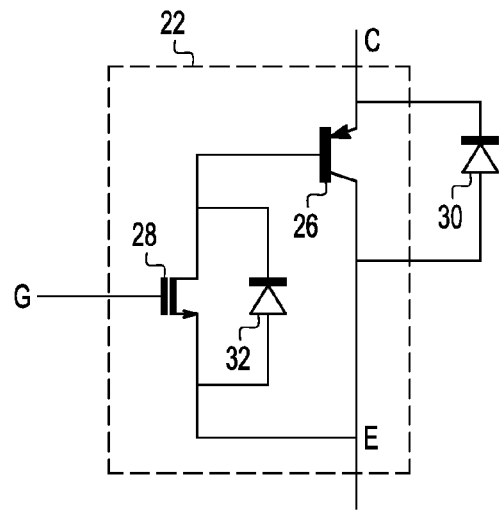
FIG. 4 schematically shows an example of an embodiment of a power switch.

FIG. 4 shows an example of a power switch 22 as may be used in the power switching device 10 presently described.

The power switch 22 may, for example, be an IGBT having a collector C, an emitter E, and a gate G. The IGBT 22 may comprise a bipolar transistor 26 having a collector and an emitter coinciding with the collector and the emitter of the IGBT. The bipolar transistor 26 may further have a basis for controlling a conductivity between the collector and the emitter. The IGBT may further comprise a MOSFET, e.g., an NMOS transistor 28 having a drain connected to the basis of the bipolar transistor 26, a source connected to the emitter E, and a gate coinciding with the gate G of the IGBT. A diode 32 may be connected between the source and the drain. The above-mentioned protective diode 30 connected between the collector C and the emitter E is also shown. The diode 30 may be integrated in the IGBT 22.

Figure 5:
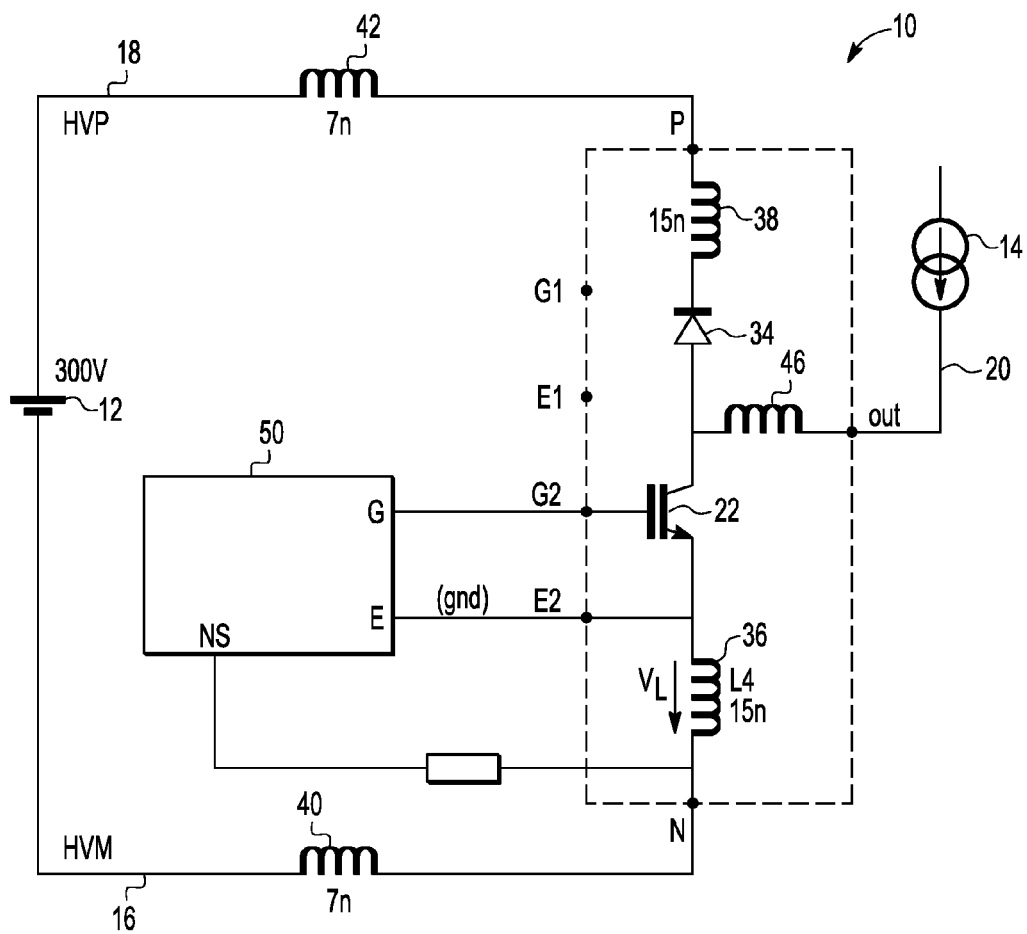
FIG. 5 schematically shows an example of an embodiment of a power switching device.

FIG. 5 shows another example of a power switching device 10. The device 10 may be that of FIG. 2 or 3. The device 10 is shown in a first operating state. In the first state, the first power switch 22 may be on (conductive), while the second power switch 24 may be off (nonconductive). The second power switch 24 being nonconductive in this state, it is not shown in the figure. Similarly, the diode 30 which may be antiparallel to the first power switch 22 is not shown in this figure. The power switching device 10 may comprise, in addition to the above-mentioned power conductors 36 and 38, power conductors 40, 42, and 46, for example. Each of the shown power conductors may have a non-negligible inductance. For instance, the power conductors 36, 38, 40, and 42 may have inductance values of 15 nanohenry, 15 nanohenry, 7 nanohenry, and 7 nanohenry, respectively. The power conductor 40 may be connected between the power supply 12 and the power conductor 36. The power conductor 42 may be connected between the supply 12 and the power conductor 38. The control unit 50 may be arranged to sense the voltage VL across the power conductor 36 and control the power switch 22 accordingly. For instance, the control unit 50 may be arranged to decrease the conductivity of the power switch 22 only when the voltage VL across the power conductor 36 is below a selected threshold.

Figure 6:
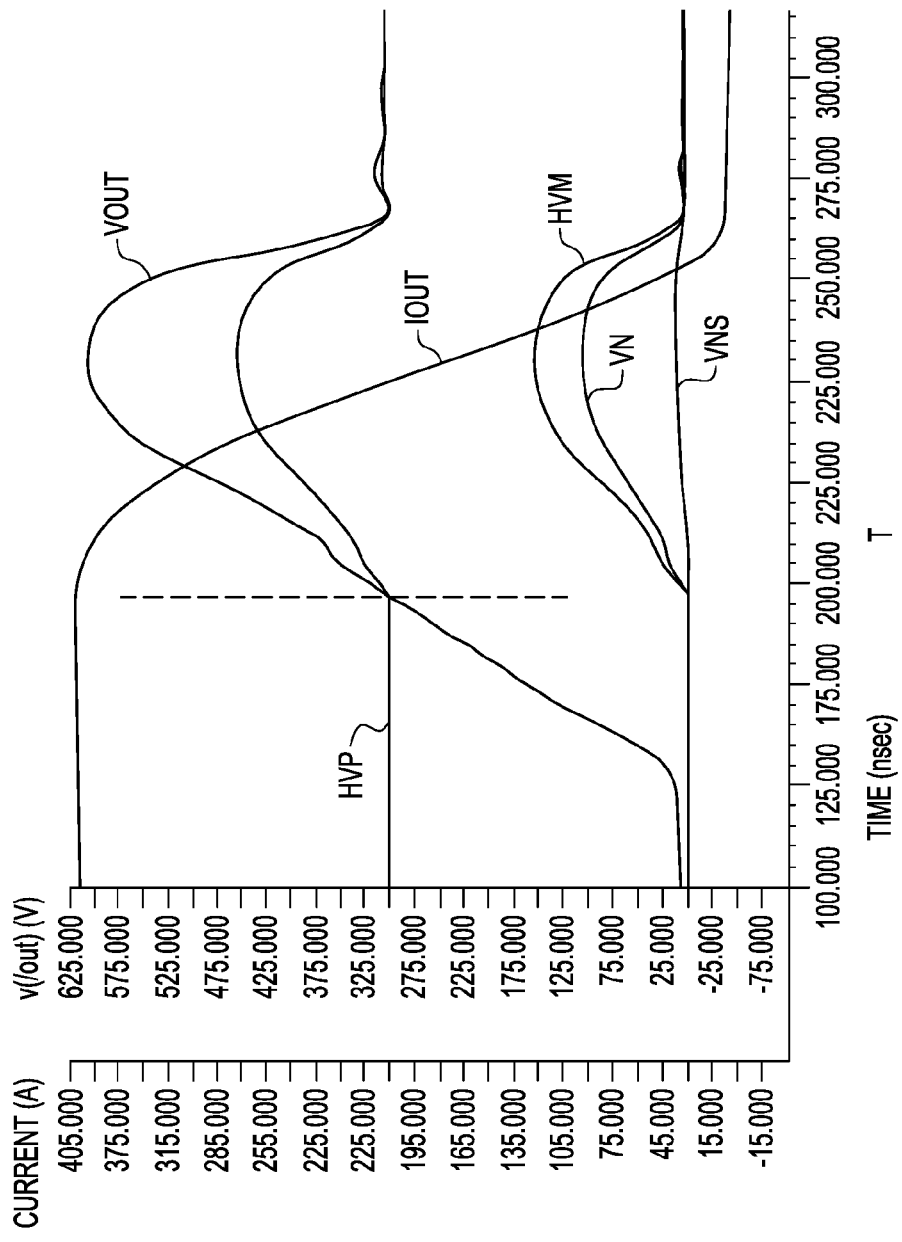
FIG. 6 shows a plot of current and voltage levels as functions of time.

Operation of the power switching device 10 of FIG. 5 is further explained by making additional reference to FIG. 6. In the plot of FIG. 6, the following quantities are represented as functions of time t: the voltage HVM at the first power terminal 16, the voltage HVP at the second power terminal 18, the output voltage Vout at the load terminal 20, the voltage VN at the node N (i.e., the node between the power conductor 36 and the power conductor 40), the voltage VNS at input NS of the control unit 50, and the current Iout through the load terminal 20 for times t between 100 ns and 325 ns. The voltage levels are plotted relative to the voltage at node E2, i.e., the node between the power conductor 36 and the first power switch 22. The voltage levels HVM and HVP are therefore not constant in the plot but may vary as the voltage of the node E2 relative to HVM and HVP varies.

At times before zero, the first power switch 22 may be on and the second power switch (not shown in FIG. 5) 24 may be off. In this situation (t=0), Vout may be low (approximately 0), and there may be a stationary current from the load 14 through, e.g., the load terminal 20, the power conductor 46, the first power switch 22, the power conductor 36, the power conductor 40, to the power terminal 16. In the example, this stationary current may have an amplitude of about 400 amperes. At time t=0, the power switch 22 may start to be turned off in a controlled manner on the basis of the voltage VL, i.e., the voltage across the power conductor 36. The output voltage Vout may accordingly increase and the current Iout may decrease. In this plot, the voltage VL across the power conductor 36, which may form the basis of the turn-off control of the power switch 22, coincides with the voltage VN.

It is noted that the induction voltage generated across the power conductor 46 and the load 14 may cause part of the original current from the load 14 to be diverted into the high side part of the circuit 10 via the diode 34. The rate of change of the current through the power conductor 36 may therefore approximately coincide in absolute value with the rate of change of the current through the power conductor 38. The current through the power conductor 36 may decrease while the current through the power conductor 38 may temporarily increase starting from zero current. In fact, the difference between Vout and HVP that may be observed in this example at times between about 175 ns and 260 ns may be the sum of a voltage across the diode 34 and the self-induction voltages in the power conductors 38, 42, and 46.

At a time t of about 275 ns, the shown voltage levels and the output current Iout may have settled to new stationary values. Notably, the output voltage Vout may have settled at the level HVP of the second power terminal 18.

Figure 7:
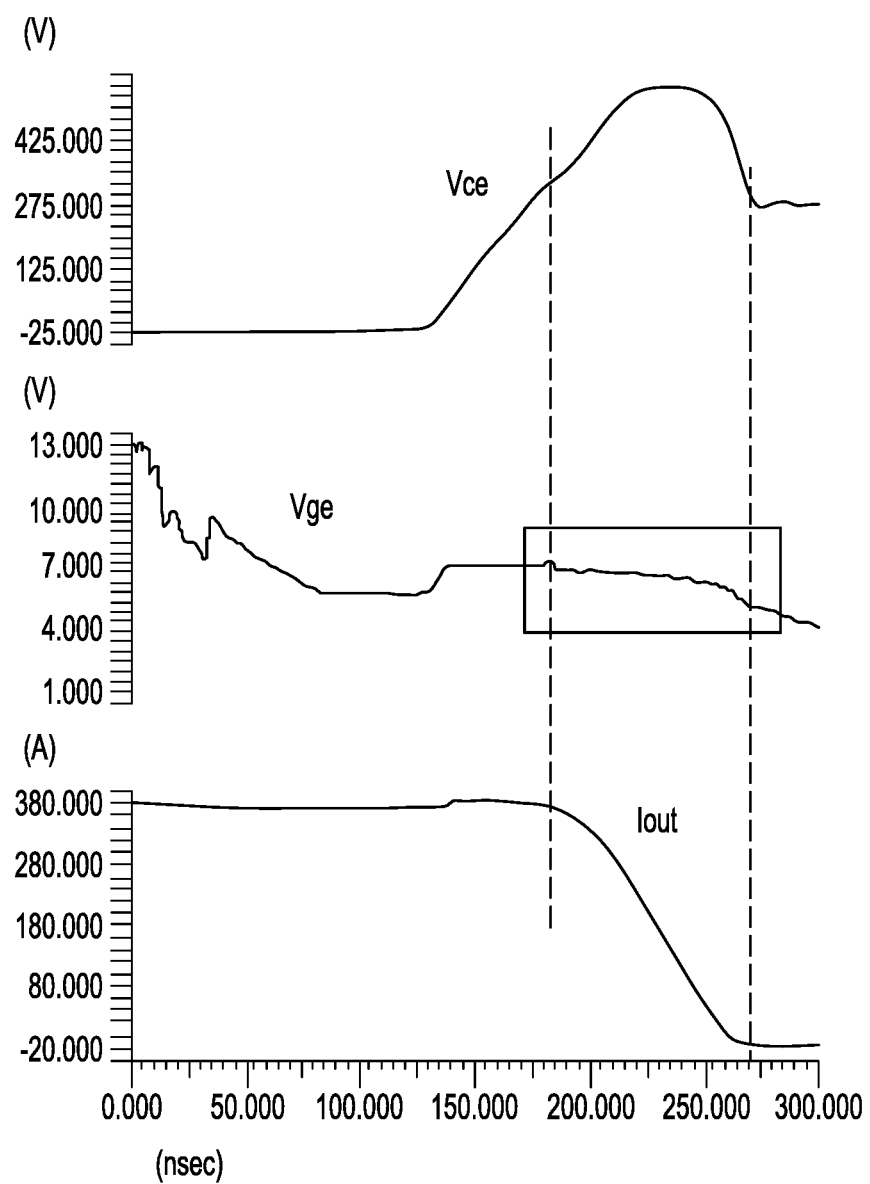
FIG. 7 shows a plot of current and voltage levels as functions of time.
Figure 8:
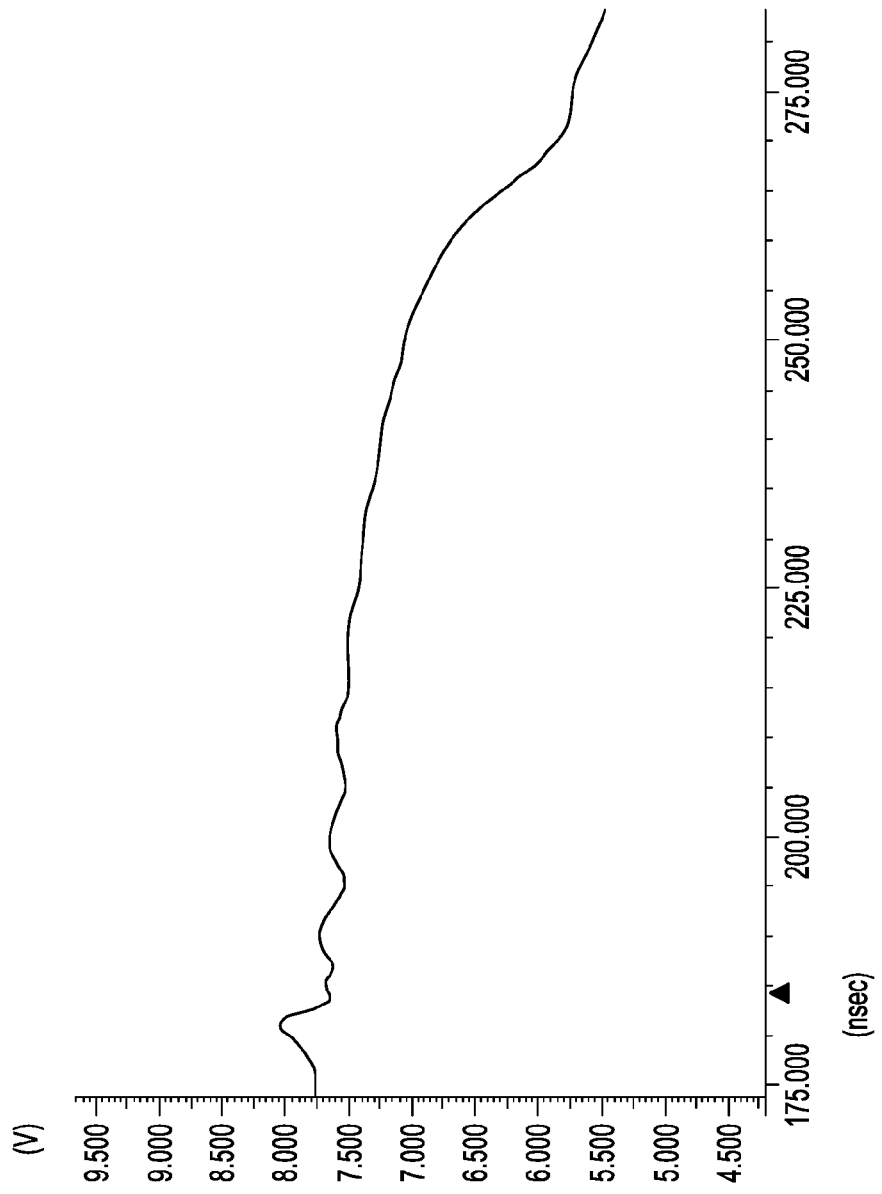
FIG. 8 shows a close-up view of a voltage level from FIG. 7.

FIG. 7 further illustrates a possible time dependence of the collector emitter voltage VCE, the gate emitter voltage VGE across the first power switch 22 along with the output current Iout at the load terminal 20 for the scenario described in reference to FIG. 6. FIG. 8 is a close-up view of the plot showing the gate emitter voltage VGE corresponding to the rectangle indicated in FIG. 7.

Figure 9:
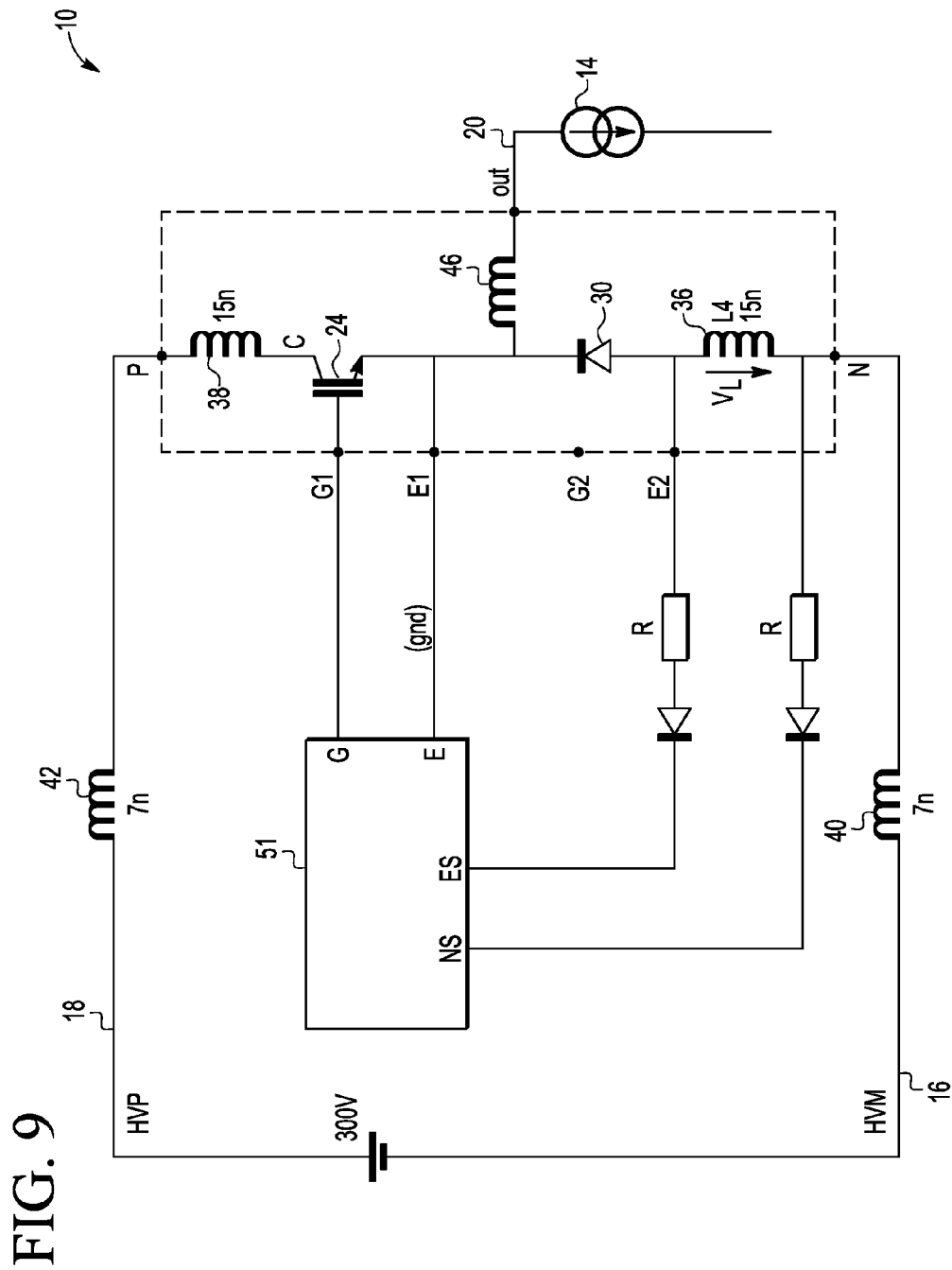
FIG. 9 schematically shows an example of an embodiment of a power switching device.

FIG. 9 shows an example of the power switching circuit 10 in a second operating state. In the second operating state, the first power switch 22 (not shown in this figure) may be off and the second power switch 24 may be on. The output voltage, i.e., the voltage at the load terminal 20, may thus be high. An electrical current may thus flow from the second power terminal 18 via the second power switch 24 and the load terminal 20 into the load 14. The control unit 51 may be arranged to control the second power switch 24, e.g., by means of a control voltage applied at a control input of the power switch 24. As mentioned above, the first power switch 22 and the second power switch 24 may each be an IGBT in which case the control input may be the gate of the IGBT. The control unit 51 may notably be arranged to control the second power switch 24 during a transition period in which the second power switch 24 is being turned off. The control unit 51 may thus ensure that the power switch 24 is not turned off abruptly but in a smooth or stepwise or pulsed manner so as to decrease its conductivity gradually rather than instantaneously.

The control unit 51 (second control unit) may be arranged similarly to the control unit 50 (first control unit) shown in FIG. 5, i.e., the second control unit 51 may be connected to the high side power conductor 38 for sensing an induced voltage across the power conductor 38 to control the power switch 24 on the basis of that induced voltage at least when the power switch 24 is being turned off. It is noted that the second power conductor 38, which, in this example, is connected to the second power switch 24, may be similar to the power conductor 36 connected to the first power switch 22 in that the current for powering the load 14 may flow through the power conductor 36 when the first power switch 22 is open and through the power conductor 38 when the second switch 24 is open. The features described above in reference to the first control unit 50 may thus be applied analogously to the second control unit 51.

In the shown example, however, the second control unit 51 is arranged in a manner which is not quite analogous to the first control unit 50. Indeed, in this example, the second control unit 51 may be arranged to sense the voltage across the power conductor 36 connected to the first power switch 22 rather than the voltage across the power conductor 38 connected to the second power switch 24. In other words, both the first control unit 50 (see FIG. 5) and the second control unit 51 (see FIG. 9) may be responsive to the same induced voltage, for instance, the voltage across the power conductor 36. The first control unit 50 and the second control unit 51 may thus share the same pick-off nodes (nodes N and E2 in the example) for sensing an induced voltage. This may be beneficial for the mechanical and electrical design of the power switching device 10. It may notably allow for a more compact design compare to an alternative design in which the first control unit 50 and the second control unit 51 have different pick-off nodes (e.g., nodes N and E2 for the first control unit 50 and nodes E1 and P for the second control unit 51) for sensing an induced voltage.

That the voltage across the power conductor 36 may be appropriate for controlling the turn-off operation of the second control switch 24 may come as a surprise because the power conductor 36 may be situated off the main current path (e.g., 18, 42, 38, 22, 46, 20, 14) when the first power switch 22 is off and the second power switch 24 is on. However, it may be observed that when the second power switch 24 is turned off, a voltage may be induced not only across the power conductor 38 (which may be in series with the second power switch 24) but also across the power conductor 36 (which may not be in series with the second power switch 24). This observation may be explained by the fact that turning off the second power switch 24 may result in an induction voltage across, e.g., the power conductor 46 or the load 14 or both. This induction voltage may generate a temporary reverse current from, e.g., the first power terminal 16 via, e.g., the power conductors 40 and 36 and the diode 30 into the load 14. The path comprising the load terminal 20, the diode 30, and e.g., the conductor 36 may therefore also be referred to as a flyback path. The current through the power conductor 36 may thus rise from 0 ampere to a certain maximum and then redescend to 0. The currents through the power conductor 36, the power conductor 38 and the load terminal 20 may be related as follows: IP=IN+Iout, wherein IP, IN, and Iout denote the respective current through node P (i.e., through power conductor 38), through node N (i.e., through power conductor 36), and through the load terminal 20. Their time derivatives may thus be related as follows: dIP/dt=dIN/dt+dIout/dt. It is noted the dIout/dt may be negligible, at least temporarily, in comparison to both dIp/t and dIn/dt. In this situation, dIP/dt and dIn/dt may be approximately equal. Since the inductance of the power conductor 36 and the inductance of the power conductor 38 may be equal, the induction voltage across the power conductor 36 may be approximately equal to the induction voltage across the power conductor 38.

Figure 10:
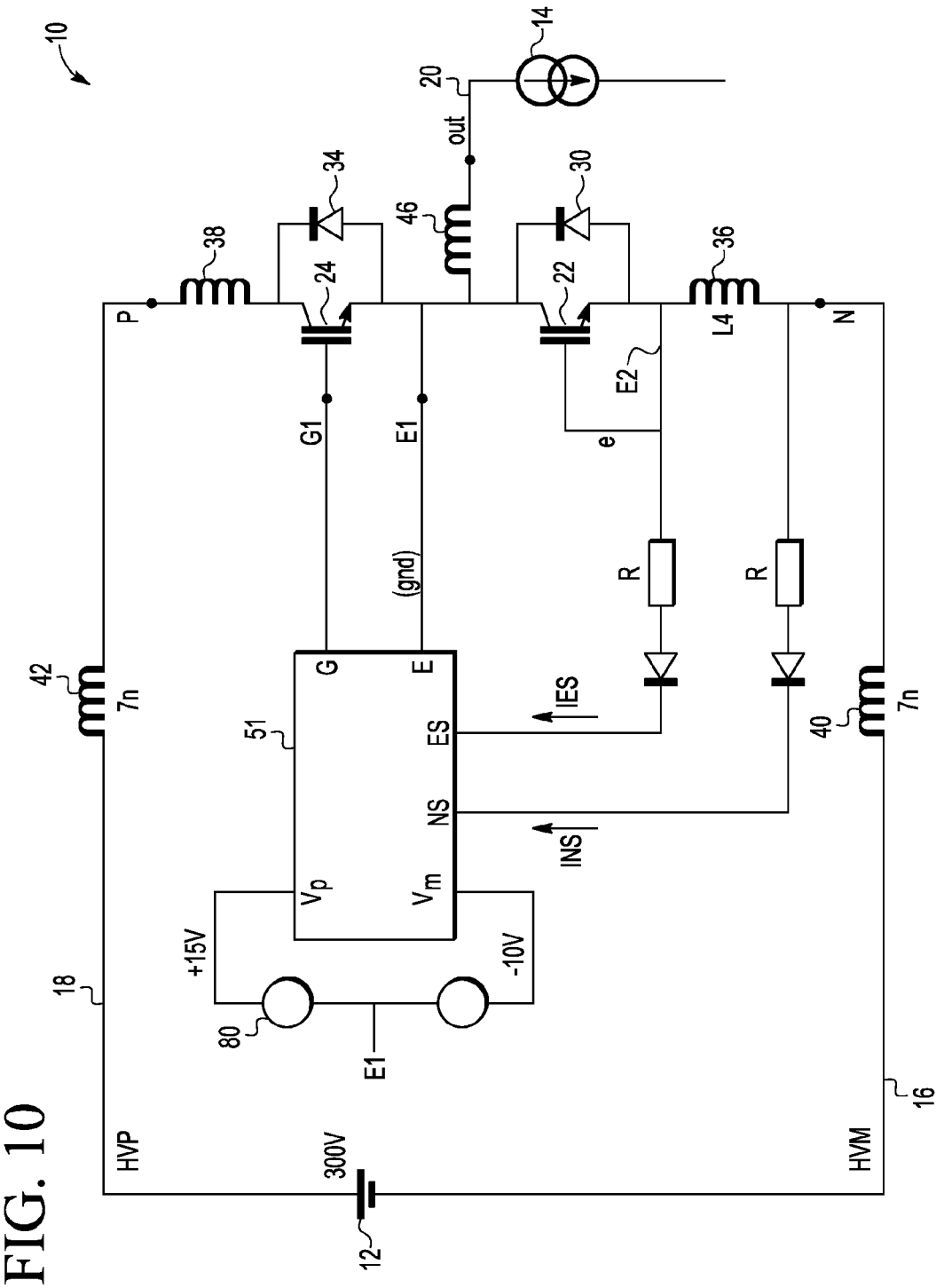
FIG. 10 schematically shows an example of an embodiment of a power switching device.

The power switching circuit 10 of FIG. 9 is further illustrated in FIG. 10. In FIG. 10, both power switches 22, 24 are shown. The control unit 50 (see FIG. 5) is not shown for the sake of clarity. The power switching device 10 may comprise, in addition to the power supply 12, a low power DC voltage source 80 for powering the first control unit 50 or second control unit 51 or both. The voltage source 80 may be arranged to be powered from the power supply 12. The voltage source 80 may, for instance, be arranged to provide a differential output voltage of, e.g., 25 volts.

The control unit 51 may have a first current input NS and a second current input ES, for example. The current inputs NS and ES may be connected to, e.g., the nodes N and E2, i.e., the two ends of the power conductor 36, respectively. The control unit 51 may thus be arranged to sense a first current proportional to the voltage at the node N and a second current proportional to the voltage at the node E2. A difference between the first current received at, e.g., input NS and the second current received, e.g., at input ES may thus be a measure of the voltage across the power conductor 36. The control unit 51 may further comprise a comparison unit (see FIG. 11) for comparing the difference between these two currents to a reference current Iref and to output a control signal, e.g., a gate control voltage at an output G, in dependence on whether the difference of the currents INS and IES exceeds the reference current Iref or not. For instance, the control unit 51 may be arranged such that the conductivity of the second power switch 24 increases when the voltage across the power conductor 36 decreases and vice versa. Alternatively, it may be arranged such that the power switch 24 is turned on when the voltage across the power conductor 36 is below a threshold and turned off when the voltage across the power conductor 36 is above that threshold. In this case, turning the power switch off may comprise switching it rapidly on and off, i.e., operating it in a pulsed manner so as to decrease its average conductivity gradually, wherein its average conductivity may be defined as its conductivity averaged over an off phase and the next on phase or averaged over an on phase and the next off phase. In other words, the control unit 51 may thus be arranged to turn the power switch 24 off in a continuous, stepwise, or pulsed manner. The same applies analogously to the first control unit 50 and the first power switch 22.

Figure 11:
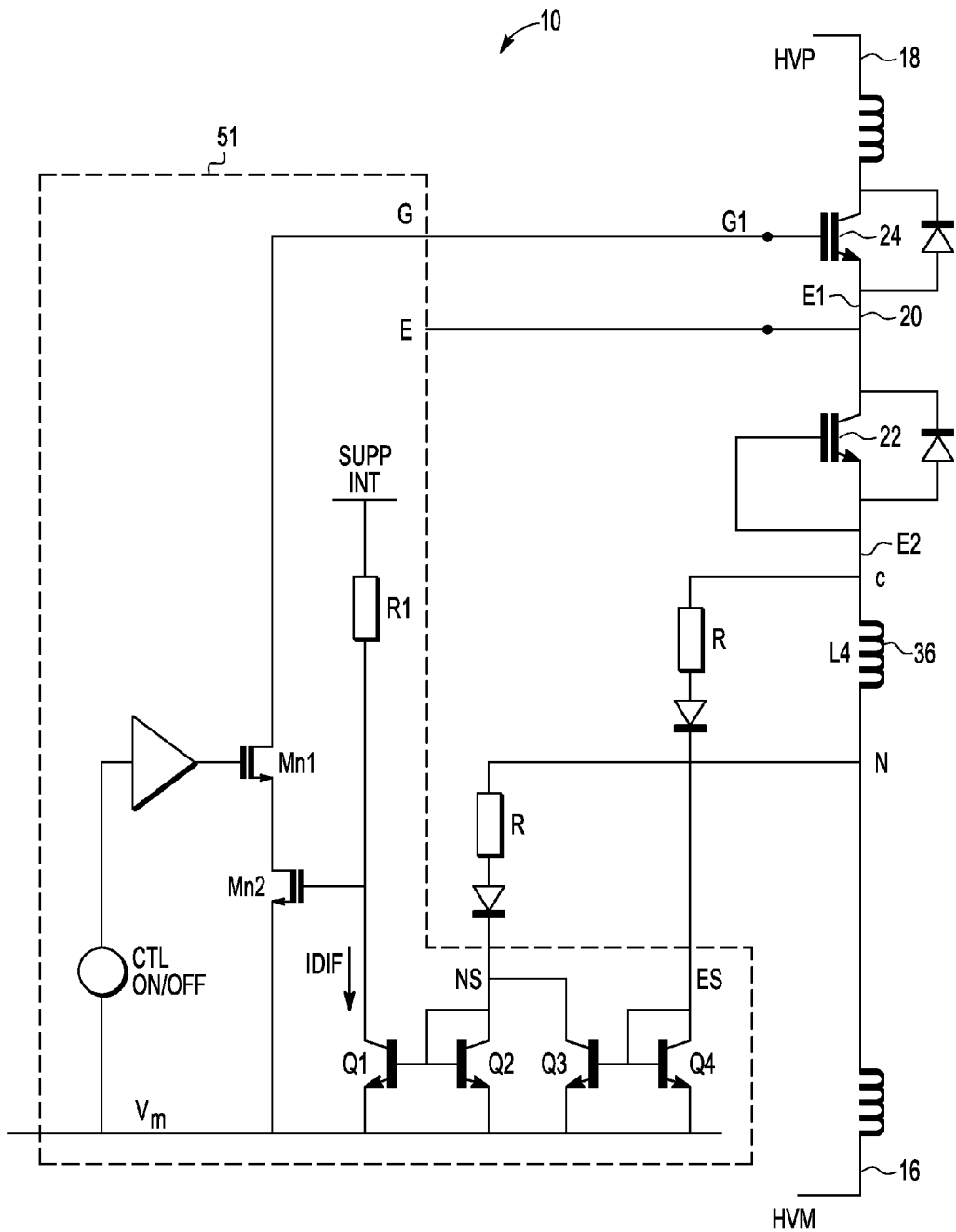
FIG. 11 schematically shows an example of an embodiment of a power switching device.

FIG. 11 illustrates an example design of the second control unit 51. The control unit 51 may have a first current input NS, a second current input ES, a first voltage output E, a second voltage output G, and a ground or reference input VM. The current inputs NS and ES may be connected to, e.g., the nodes N and ES of the power line between the first power terminal 16 and the second power terminal 18, respectively. The first voltage output E may be connected, for example, to the emitter or source of the second power switch 24. The second voltage output G may be connected, for example, to the gate G1 of the power switch 24, considering the example in which the power switch 24 is a transistor, e.g., an IGBT.

The control unit 51 may thus sense the voltage across the power conductor 36 and adapt the differential voltage output at its outputs E and G accordingly. A resistive element R may be connected to the nodes NS and N and between the nodes ES and E, respectively. These resistive elements may have the same resistance R. The current received at NS may thus be IES=(VE2−VM)/R. The current received at current input NS may be INS=(VN−VM)/R. Their difference may thus be Idif=IES−INS=(VE2−VM)/R. The difference current Idif may be generated, for example, by means of a first current mirror Q1, Q2 and a second current mirror Q3, Q4 which may be suitably interconnected and connected to the nodes N and E2, respectively. The control unit 51 may further comprise a first switch MN1 and a second switch MN2. The switches MN1 and MN2 may be connected in series between the first current mirror Q1, Q2 and, e.g., the first voltage output G. More specifically, an output of the first current mirror Q1 and Q2 may be arranged to draw the difference current Idif via a resistive element R1 which may be connected to an internal voltage source SUPP_INT. The second switch MN2 may thus be controlled by a control voltage depending on the difference current Idif. The first power switch MN1 may be arranged to be on or off in dependence on a control signal CTL_ON/OFF. For instance, to turn the power switch 24 on, the first switch MN1 may be switched off. To turn the power switch 24 off, the first switch MN1 may be switched on.

Figure 12:
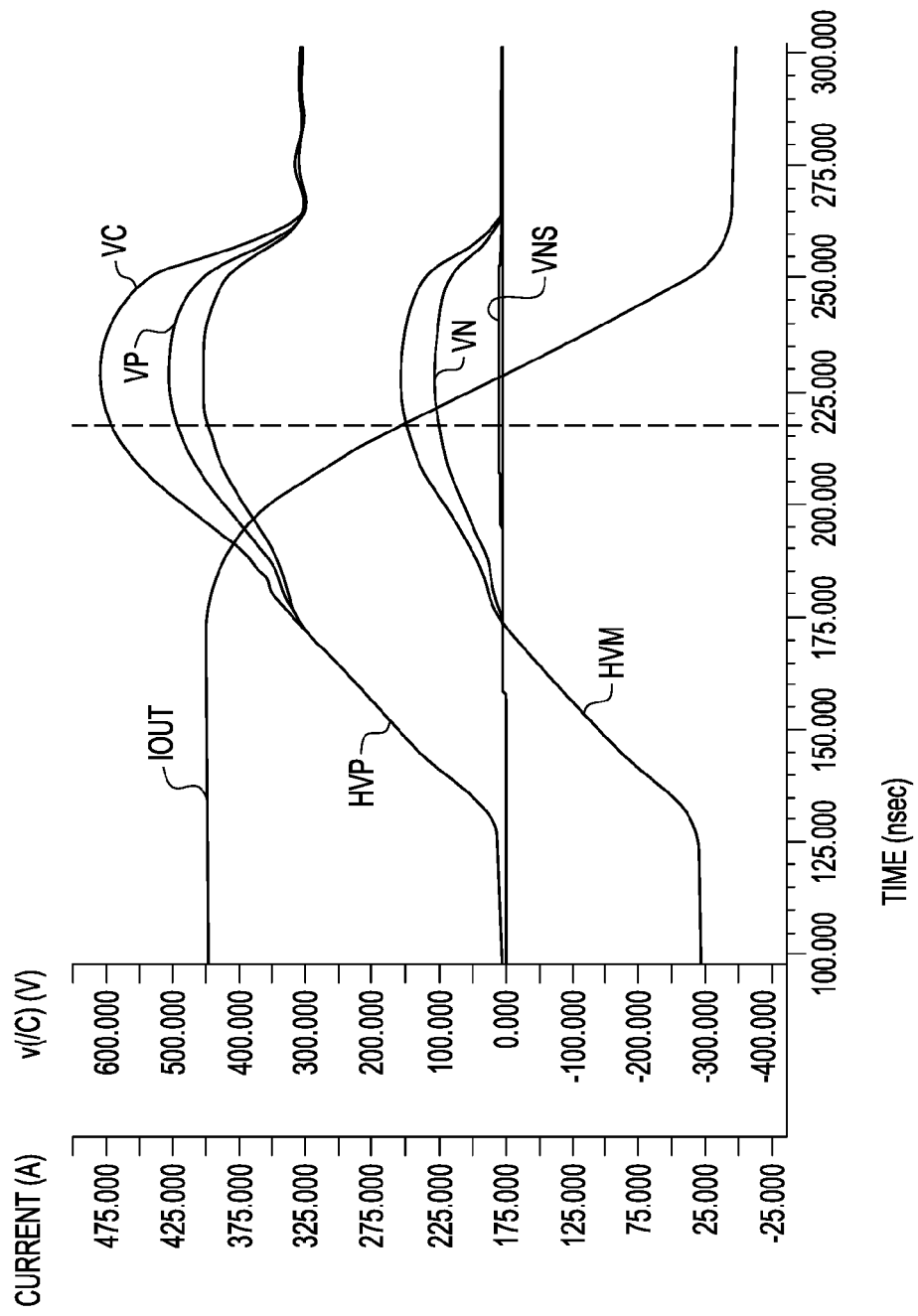
FIG. 12 shows a plot of current and voltage levels as functions of time.

Referring now to FIG. 12, the plot illustrates a possible time dependence of voltage levels and current levels as may be observed when the second power switch 24 in FIG. 10 is turned off. In this example, the power switch 24 may be turned off in a controlled manner so as to prevent the induction voltage across the power conductor 36 from exceeding a critical value. It is noted, however, that the plot may be qualitatively similar for a scenario in which the second power switch 24 is turned off abruptly, e.g., quasi instantaneously. In the latter scenario, the peaks observed in some of the voltage levels may be expected to be more pronounced. In the figure, Iout indicates the output current, i.e., the current at the load terminal 20. HVM and HVP may be the voltage level at the first power terminal 16 and the second power terminal 18, respectively. VNS, VN, VP, and VC may indicate the voltage levels at the nodes NS, N, P, and C, respectively. C may be the collector of the power switch 24. The voltage levels are plotted relative to the voltage at the node E1 (see FIGS. 5, 9, and 10). The time dependence of these quantities may be analogous to the one described above in reference to FIGS. 6 to 8. It is therefore only noted here that the induction voltage across the power conductor 36 may coincide approximately with the level VN. However, while the induction voltage across the power conductor 36 in the scenario of FIG. 6 was due to the current through the power conductor 36 decreasing from its initial stationary non-zero operating value, the induction voltage across the power conductor 36 in the scenario of present FIG. 12 may be due to the current through the power conductor 36 increasing from its initial stationary operating value of zero amperes as the load 14 attempts to sustain its current.

Figure 13:
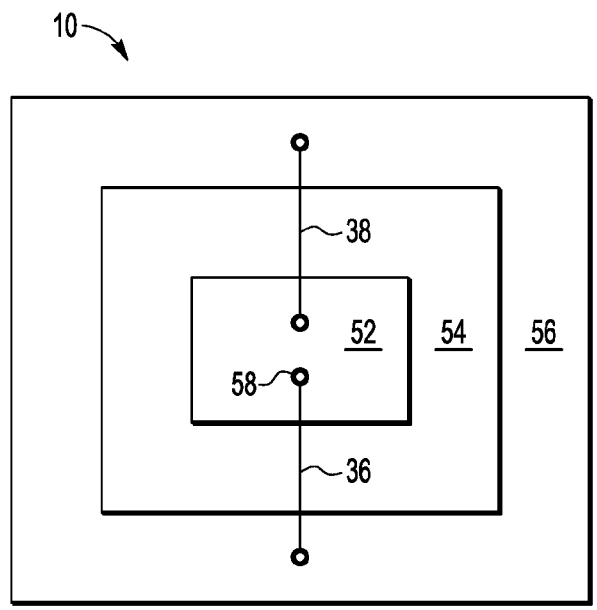
FIG. 13 schematically shows an example of an embodiment of a power switching device.

FIG. 13 schematically shows an example of a power switching device 10, e.g., the device described above in reference to the preceding figures. The power switching device 10 may comprise, e.g., a substrate 52 and, e.g., a carrier 56. The key components of the device 10 such as the power switches 22 and 24 and the control units 50 and 51 may be arranged on the substrate 52. The substrate may, for example, comprise a printed cardboard (PCB). The carrier 56 may serve as an interface between these components and the power supply 12 (see, e.g., FIG. 3). The carrier 56 may further be arranged to protect the substrate 52 and the components arranged thereon against hazards such as mechanical strain, mechanical impact, or electromagnetic stress. In this example, the power conductor 36 may be a wire or a set of wires, e.g., having a first end 58 attached to substrate 52 and a second end 60 attached to the carrier 56. The power conductor 36 may thus provide a conductive bridge across an interspace 54 between the substrate 52 and the carrier 56. The power conductor 38 may similarly be a wire or a plurality of wires or any other suitable conductive element, e.g., having a first end connected to the substrate 52 and a second end connected to the carrier 56. The power conductors 36 and 38 may thus be used to feed power to the electric and electronic components on the substrate 52. They may therefore be easily accessible. The voltage across one of them or each of them may therefore be sensed more accurately compared to, for example, an inductive element on the substrate 52.

In summary, the turn-off process for a power switch may be improved. This may allow for higher switching rates and reduce commutation losses. Furthermore, no freewheeling diode across the power switch (e.g., 22 or 24) may be required.

Figure 14:
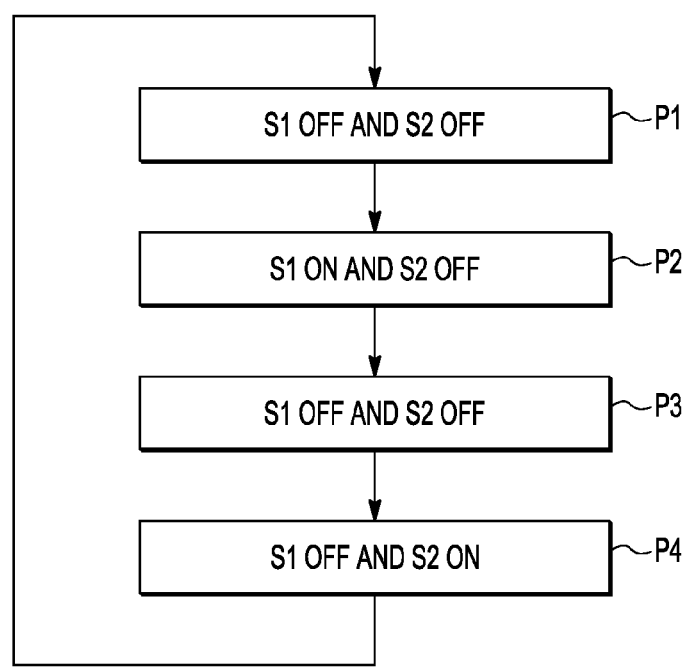
FIG. 14 shows a flow chart of an example of an embodiment of a method of operating a power switching device.

FIG. 14 illustrates an example of an operating cycle of a power switching device, e.g., a power switching device 10 as described above in reference to the preceding figures. The cycle may comprise, e.g., a first phase P1, a second phase P2, a third phase P3, and fourth phase P4. In the first phase P1, a first power switch, e.g., power switch 22, and a second power switch, e.g., power switch 24 may both be off, i.e., nonconductive. The first power switch 22 may then be turned on, while the second power switch may remain off. In phase P2, the first power switch 22 may thus be on, while the second power switch 24 may be off. The power switching device 10 may thus be in the first operating state mentioned above. During phase P2, an output voltage, e.g., the output voltage Vout provided at, e.g., the load terminal 20 may settle at a first stationary level. This level may, for instance, be a low level.

The first power switch 22 may then be turned off so that both power switches 22 and 24 may again be off (phase P3). Turning the power switch 22 off may involve turning it off in a continuous or stepwise or pulsed manner on the basis of a voltage sensed across a power conductor of the power switching device, e.g., the power conductor 36. The first power switch 22 may thus be turned off rapidly without generating an induction voltage that could be detrimental to the device.

In the subsequent phase P4, the first power switch 22 may remain off, while the second power switch 24 may be turned on. The power switching device 10 may thus assume its second operating state, and the output voltage may settle at a second stationary voltage level, e.g., at a high level. The second power switch may then again be turned off and the process may be continued with a new cycle P1, P2, P3, P4. The second power switch 24 may be turned off in a controlled manner similar to the turn off operation described above for the first power switch 22. In other words, the second power switch 24 may be controlled on the basis of a voltage sensed across a power conductor of the power switching device 10. As pointed out above, the same power conductor may be used for controlling both the first power switch 22 and the second power switch 24. In other words, the first power switch and the second power switch may be responsive to the voltage across the same power conductor, e.g., power conductor 36.

The phases during which both power switches may be off, e.g., phase P1 and phase P3, may be short or even negligibly short compared to the phases in which one of the switches is conductive, e.g., phases P2 and P4. The cycle P1, P2, P3, P4 may be implemented, for instance, by controlling the first power switch and the second power switch using a pulse-width modulated (PWM) signal. The phases P1 to P4 may have a duration of T1, T2, T3, and T4, respectively. T1 and T3 may be negligible. The average level of the output voltage, i.e., the output voltage averaged over the cycle P1 to P4, may thus be (P2*Vout1+P4*Vout2)/T, where T is the duration of the cycle, i.e., t=T1+T2+T3+T4, and where Vout1 and Vout2 are the output voltage levels during the first operating state, e.g., during phase P2, and during the second operating state, e.g., during phase P4.

In the foregoing specification, the invention has been described with reference to specific examples of embodiments of the invention. It will, however, be evident that various modifications and changes may be made therein without departing from the broader spirit and scope of the invention as set forth in the appended claims.

For example, the semiconductor substrate described herein can be any semiconductor material or combinations of materials, such as gallium arsenide, silicon germanium, silicon-on-insulator (SOI), silicon, monocrystalline silicon, the like, and combinations of the above.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. For example, the control units 50 and 51 may be merged in a single unit.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. For example, the switches 22, 24 and the control units 50, 51 may be located on a single integrated circuit. Alternatively, the examples may be implemented as any number of separate integrated circuits or separate devices interconnected with each other in a suitable manner. For example, the switches 22, 24 may be located in a first device and the control units 50, 51 may be located in a separate second device.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A power switching device connected or connectable between a power supply and a load, for providing an output voltage to said load, said power switching device having at least two different operating states, each of said operating states having a different level of said output voltage associated with it, said power switching device comprising:
   a power terminal connected or connectable to said power supply;
   a load terminal connected or connectable to said load, for providing said output voltage;

a power switch connected between said power terminal and said load terminal and arranged to be conductive in a first one of said operating states;

a power conductor connected between said power terminal and said load terminal in at least one of said states, wherein an electrical current through said power conductor changes in response to said power switch being turned off, thereby causing self-induction in said power conductor; and a control unit arranged to control said power switch in real-time on the basis of a real-time level of a voltage across said power conductor so as to turn off said power switch in a continuous or stepwise or pulsed manner to prevent said voltage across said power conductor from exceeding a maximum allowed level.

2. The power switching device of claim 1, wherein in said first state, said load terminal is connected to said power terminal via a conductive path comprising said power switch and said power conductor.

3. The power switching device of claim 1, wherein in said first state said load terminal is connected to said power terminal via a conductive path comprising said power switch but not said power conductor.

4. The power switching device of claim 3, wherein in said first state said current through said power conductor is small compared to a current through said first power switch.

5. The power switching device of claim 3, comprising a flyback path in which a flyback current is generated in response to turning off said power switch, said flyback path comprising said power conductor.

6. The power switching device of claim 1, wherein
said power switch is a first power switch,
said power switching device comprises a second power switch,
said operating states comprise a second state in which said second power switch is conductive and said first power switch is nonconductive,
said electrical current through said power conductor changes in response to said second power switch being turned off, thereby inducing a voltage across said power conductor; and
said control unit is further arranged to control said second power switch in real-time on the basis of a real-time level of said voltage across said power conductor so as to turn off said second power switch in a continuous or stepwise or pulsed manner to prevent said voltage across said power conductor from exceeding a maximum allowed level.

7. The power switching device of claim 6, wherein said power terminal is a first power terminal and said power switching device comprises a second power terminal connected or connectable to said power supply to provide a voltage between said first power terminal and said second power terminal, said first power switch being connected between said first power terminal and said load terminal, said second power switch being connected between said second power terminal and said load terminal.

8. The power switching device of claim 7, wherein said power conductor is connected between said first power terminal and said first power switch.

9. The power switching device of claim 6, comprising a protective element connected antiparallel across said first power switch.

10. The power switching device of claims 1, comprising:
a substrate carrying said power switch and
a carrier carrying said power terminal,
wherein said power conductor comprises a wire having a first end fixed to said substrate and a second end fixed to said carrier.

11. The power switching device of claim 1, comprising a bridge across said power conductor for sensing said voltage across said power conductor.

12. The power switching device of claim 1, wherein no freewheeling diode is connected in parallel to said power conductor.

13. A three-phase bridge inverter comprising a first, second, and third power switching device as set forth in claim 1, said first, second, and third power switching device arranged to output a cyclic first, second, and third output voltage with a relative phase shift of 0°, 120° and 240°, respectively.

14. The three-phase bridge inverter of claim 13, wherein said load is a three-phase induction motor connected to the output terminal of each of the first, second, and third power switching device.

15. A method of operating a power switching device, said power switching device being connected between a power supply and a load to provide an output voltage to said load and having at least two different operating states, each of said operating states having a different level of said output voltage associated with it, said power switching device comprising:
a power terminal connected or connectable to said power supply;
a load terminal connected or connectable to said load, for providing said output voltage;
a power switch connected between said power terminal and said load terminal and arranged to be conductive in a first one of said operating states; and
a power conductor connected between said power terminal and said load terminal in at least one of said states, wherein an electrical current through said power conductor changes in response to said power switch being turned off, thereby causing self-induction in said power conductor;
wherein the method comprises:
controlling said power switch in real-time on the basis of a real-time level of a voltage across said power conductor so as to turn off said power switch in a continuous or stepwise manner to prevent said voltage across said power conductor from exceeding a maximum allowed level.

* * * * *